United States Patent
Lee

(10) Patent No.: US 10,020,414 B2
(45) Date of Patent: Jul. 10, 2018

(54) SOLAR CELL AND MANUFACTURING METHOD THEREFOR

(71) Applicant: LG INNOTEK CO., LTD., Seoul (KR)

(72) Inventor: Dong Keun Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/027,111

(22) PCT Filed: Sep. 26, 2014

(86) PCT No.: PCT/KR2014/009066
§ 371 (c)(1),
(2) Date: Apr. 4, 2016

(87) PCT Pub. No.: WO2015/050341
PCT Pub. Date: Apr. 9, 2015

(65) Prior Publication Data
US 2016/0240717 A1 Aug. 18, 2016

(30) Foreign Application Priority Data
Oct. 2, 2013 (KR) .................. 10-2013-0118217

(51) Int. Cl.
*H01L 31/00* (2006.01)
*H01L 31/0749* (2012.01)
(Continued)

(52) U.S. Cl.
CPC .. *H01L 31/0749* (2013.01); *H01L 31/022425* (2013.01); *H01L 31/022441* (2013.01);
(Continued)

(58) Field of Classification Search
CPC ......... H01L 31/0749; H01L 31/035281; H01L 31/022441; H01L 31/022425; H01L 31/0463; Y02P 70/521; Y02E 10/541
(Continued)

(56) References Cited

U.S. PATENT DOCUMENTS

| | | |
|---|---|---|
| 5,100,480 A | 3/1992 | Hayafuji |
| 5,468,988 A * | 11/1995 | Glatfelter ............ H01L 31/046 136/244 |

(Continued)

OTHER PUBLICATIONS

International Search Report in International Application No. PCT/KR2014/009066, filed Sep. 26, 2014.

*Primary Examiner* — Angelo Trivisonno
(74) *Attorney, Agent, or Firm* — Saliwanchik, Lloyd & Eisenschenk

(57) ABSTRACT

A solar cell, according to one embodiment, comprises: a support substrate; a rear electrode layer arranged on the support substrate; an optical absorption layer arranged on the rear electrode layer; a buffer layer arranged on the optical absorption layer; and a front electrode layer arranged on the buffer layer, wherein a first through-groove penetrating through the rear electrode layer and the optical absorption layer is formed on the rear electrode layer and the optical absorption layer, and the optical absorption layer comprises: a first optical absorption layer arranged on the rear electrode layer; and a second optical absorption layer arranged to make contact with an inner side surface of the rear electrode layer exposed by the first through-groove.

20 Claims, 4 Drawing Sheets

(51) Int. Cl.
  *H01L 31/0224*     (2006.01)
  *H01L 31/0463*     (2014.01)
  *H01L 31/0352*     (2006.01)

(52) U.S. Cl.
  CPC .. *H01L 31/035281* (2013.01); *H01L 31/0463* (2014.12); *Y02E 10/541* (2013.01); *Y02P 70/521* (2015.11)

(58) Field of Classification Search
  USPC .................................................. 136/256
  See application file for complete search history.

(56) References Cited

U.S. PATENT DOCUMENTS

| | | |
|---|---|---|
| 6,011,215 A | 1/2000 | Glatfelter et al. |
| 2002/0160553 A1 | 10/2002 | Yamanaka et al. |
| 2009/0165840 A1* | 7/2009 | Murata ............ H01L 31/02246 136/244 |
| 2013/0056758 A1 | 3/2013 | Ziltener et al. |

* cited by examiner

SOLAR CELL AND MANUFACTURING METHOD THEREFOR

CROSS-REFERENCE TO RELATED APPLICATION

This application is the U.S. national stage application of International Patent Application No. PCT/KR2014/009066, filed Sep. 26, 2014, which claims priority to Korean Application No. 10-2013-0118217, filed Oct. 2, 2013, the disclosures of each of which are incorporated herein by reference in their entirety.

TECHNICAL FIELD

The embodiment relates to a solar cell and a method for manufacturing the same.

BACKGROUND ART

A method of manufacturing a solar cell for solar light power generation is as follows. First, after preparing a substrate, a rear electrode layer is formed on the substrate and patterned by a laser, thereby forming a plurality of rear electrodes.

Then, an optical absorption layer, a buffer layer, and a high resistance buffer layer are sequentially formed on the rear electrodes. The optical absorption layer can be formed by extensively using various schemes including a scheme of forming a $Cu(In,Ga)Se_2$ (CIGS) based-optical absorption layer by simultaneously or separately evaporating Cu, In, Ga, and Se and a scheme of performing a selenization process after a metallic precursor film has been formed.

Then, the buffer layer including cadmium sulfide (CdS) is formed on the optical absorption layer through the sputtering process.

Next, groove patterns may be formed in the optical absorption layer, the buffer layer, and the high resistance buffer layer.

Then, a transparent conductive material is deposited on the high resistance buffer layer and the transparent conductive material is filled in the groove pattern. Thus, a transparent electrode layer is formed on the high resistance buffer layer and connection wires are formed inside the groove patterns, respectively.

After that, the groove pattern is formed in the transparent electrode layer, thereby forming a plurality of solar cells. The transparent electrodes and the high-resistance buffers correspond to cells, respectively. The transparent electrodes and the high-resistance buffers may be arranged in the form of a stripe or a matrix.

The transparent electrodes are misaligned with the rear electrodes and the transparent electrodes are electrically connected with the rear electrodes through the connection wires. Therefore, a plurality of solar cells can be electrically connected with each other in series.

Meanwhile, according to the related art, the rear electrode layer is divided into a plurality of rear electrodes by patterning the rear electrode layer and the optical absorption layer, the buffer layer and the front electrode layer are deposited on the rear electrodes to manufacture the solar cell.

However, the deposition process for the optical absorption layer is carried out at the high temperature of 500° C. or above, so the support substrate may be bent while the deposition process for the optical absorption layer is being carried out. Such a bending of the support substrate may exert an influence upon the rear electrode layer so that the pattern formed in the rear electrode layer may also be bent. Due to the bending phenomenon, a non-generation region, that is, a dead zone area is increased in the solar cell so that the efficiency of the solar cell may be deteriorated.

Therefore, there are required to provide a solar cell having a new structure capable of preventing a support substrate from being bent and a method for manufacturing the same.

DISCLOSURE

Technical Problem

The embodiment provides a solar cell of a new structure having an improved photoelectric conversion efficient and a method for manufacturing the same.

Technical Solution

A solar cell according to the embodiment includes a support substrate; a rear electrode layer on the support substrate; an optical absorption layer on the rear electrode layer; a buffer layer on the optical absorption layer; and a front electrode layer on the buffer layer, wherein a first through-groove is formed through the rear electrode layer and the optical absorption layer, and the optical absorption layer includes: a first optical absorption layer on the rear electrode layer; and a second optical absorption layer making contact with an inner side surface of the rear electrode layer exposed through the first through-groove.

Advantageous Effects

The method for manufacturing a solar cell and the solar cell manufactured by the method according to the embodiment can reduce the dead zone area in the solar cell so that the efficiency of the solar cell can be improved.

According to the related art, after forming a rear electrode layer on a support substrate, first through-grooves are formed to divide the rear electrode layer into a plurality of rear electrodes. Then, the optical absorption layer and the buffer layer are formed on the rear electrodes having the first through-grooves. However, the process for forming the optical absorption layer is carried out at the high temperature of 500° C. or above, so the first through-grooves formed in the rear electrode layer may be bent by heat having the high temperature when the optical absorption layer is formed.

For this reason, according to the related art, when second through-grooves have been formed in parallel to and spaced apart from the first through-grooves, the spacing distance between the first through-grooves and the second through-grooves may be increased due to the bending of the first through-grooves, so that the dead zone area may be increased, deteriorating the overall efficiency of the solar cell.

Therefore, according to the method for manufacturing a solar cell and the solar cell manufactured by the method of the embodiment, the process for forming the optical absorption layer is primarily performed in the high temperature, and then the first through-grooves are formed through the optical absorption layer and the rear electrode layer.

Thus, the first through-grooves may not be deformed, that is, may not be bent in the subsequent processes so that the dead zone area may not be increased.

In addition, according to the method for manufacturing a solar cell and the solar cell manufactured by the method of the embodiment, the optical absorption layer may be inclined in the first through-grooves. In other words, the optical absorption layer or the second optical absorption layer can surround the lateral side of the rear electrode layer exposed through the first through-grooves.

Since the first through-grooves are formed after the optical absorption layer has been formed as described above, the short between the front electrode and the rear electrode, which may be generated when the front electrode is disposed in the first through-groove, can be prevented.

In detail, according to the method for manufacturing a solar cell and the solar cell manufactured by the method of the embodiment, the first through-grooves are formed after the optical absorption layer has been formed, so that the width of the first through-grooves can be reduced. In addition, since the optical absorption layer or the second optical absorption layer can surround the inner side surface of the rear electrode layer, the short between the front electrode and the rear electrode can be prevented.

Therefore, according to the method for manufacturing a solar cell and the solar cell manufactured by the method of the embodiment, the dead zone area can be reduced, so that the overall efficiency of the solar cell can be improved.

BEST MODE

Mode for Invention

Figure 1:
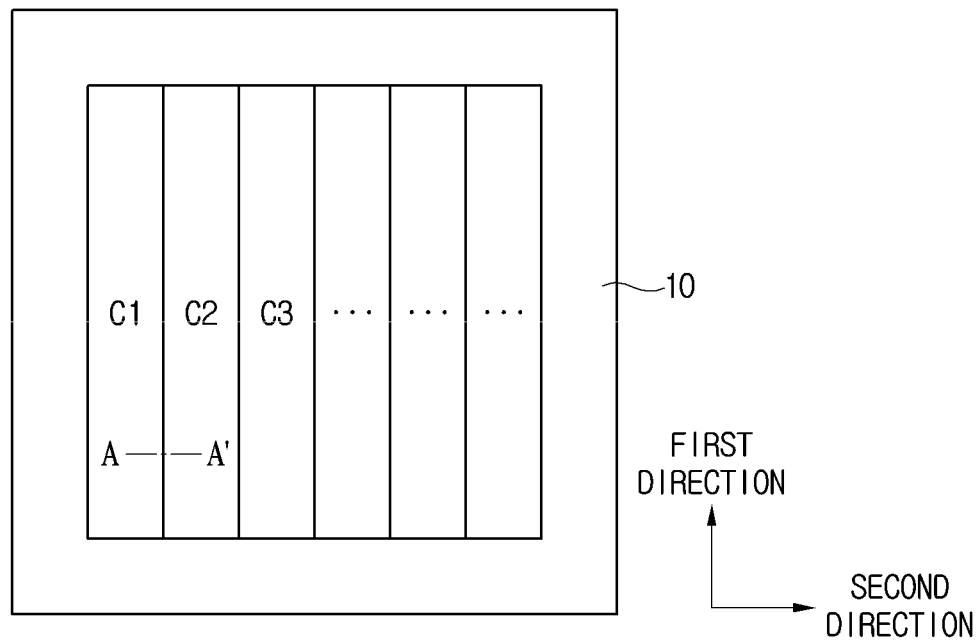
FIG. 1 is a plan view showing a solar cell according to an embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer (or film), each region, each pattern, or each structure shown in the drawings may be exaggerated, omitted or schematically drawn for the purpose of convenience or clarity. In addition, the size of elements does not utterly reflect an actual size.

Hereinafter, the embodiments of the present invention will be described in detail with reference to accompanying drawings.

A solar cell according to an embodiment will be described in detail with reference to FIGS. 1 and 2. FIG. 1 is a plan view showing a solar cell according to an embodiment and FIG. 2 is a sectional view showing a solar cell according to an embodiment.

Figure 2:
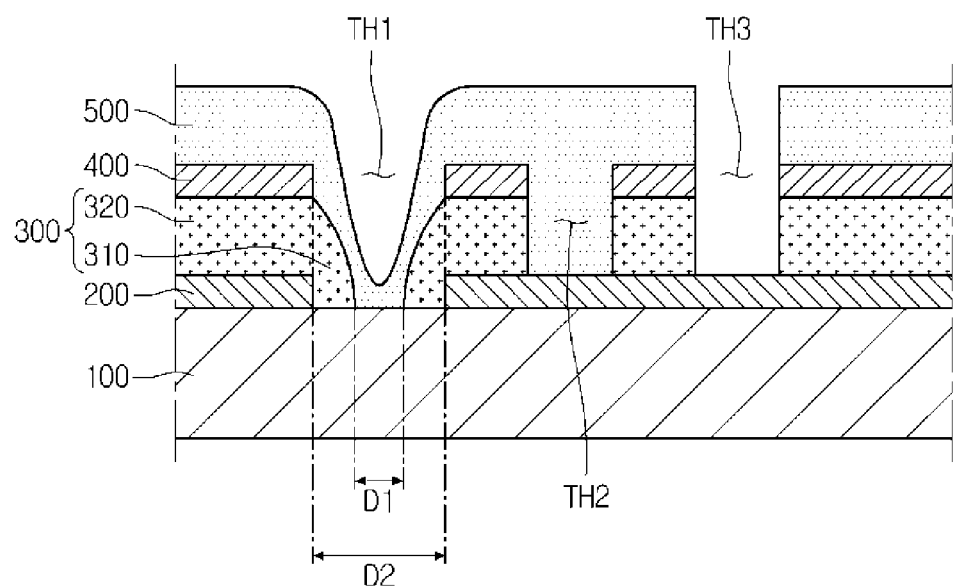
FIG. 2 is a sectional view showing a solar cell according to an embodiment.

Referring to FIGS. 1 and 2, the solar cell according to an embodiment may include a support substrate 100, a rear electrode layer 200, an optical absorption layer 300, a buffer layer 400, and a front electrode layer 500.

The support substrate 100 may have a plate shape and support the rear electrode layer 200, the optical absorption layer 300, the buffer layer 400 and the front electrode layer 500.

The support substrate 100 may include an insulator. The support substrate 100 may be a glass substrate, a plastic substrate, or a metal substrate. Meanwhile, the support substrate 100 may be a soda lime glass substrate. Otherwise, the support substrate 100 may include a ceramic substrate formed of alumina, or may include stainless steel or flexible polymer. The support substrate 100 may be transparent. The support substrate 100 may be rigid or flexible.

The rear electrode layer 200 may be provided on the support substrate 100. The rear electrode layer 200 may be a conductive layer. The rear electrode 200 may be formed by using one of molybdenum (Mo), gold (Au), aluminum (Al), chrome (Cr), tungsten (W) and copper (Cu). Among them, since the molybdenum (Mo) has a thermal expansion coefficient similar to that of the support substrate 100, the molybdenum (Mo) represents the superior adhesive property, so delamination may be prevented.

In addition, the rear electrode layer 200 may include at least two layers. In this case, the layers may include the same metal or mutually different metals.

The optical absorption layer 300 may be disposed on the rear electrode layer 20.

The optical absorption layer 300 may include group I-III-VI compounds. For instance, the optical absorption layer 300 may include the $Cu(In,Ga)Se_2$ (CIGS) crystal structure, the $Cu(In)Se_2$ crystal structure, or the $Cu(Ga)Se_2$ crystal structure.

The optical absorption layer 300 may have an energy bandgap in the range of about 1 eV to about 1.8 eV.

The optical absorption layer 300 may be formed therein with first through-grooves TH1. In detail, the first through-grooves TH1 may be formed through the optical absorption layer 300 and the rear electrode layer 200. A top surface of the support substrate 100 may be exposed through the first through-grooves TH1.

Each of the first through-grooves TH1 may have a width in the range of about 10 μm to about 200 μm. In detail, the first through-grooves TH1 may have a width in the range of about 10 μm to about 100 μm.

The optical absorption layer 300 may be disposed on the top surface of the rear electrode layer 200 and in the first through-grooves TH1. In detail, the optical absorption layer 300 may be disposed while surrounding the top surface of the rear electrode layer 200 and an inner side surface of the rear electrode layer exposed through the first through-grooves TH1.

The optical absorption layer 300 may be inclined in the first through-grooves TH1. In detail, the optical absorption layer 300 may be inclined in such a manner that the spacing distance between the optical absorption layers 300 divided by the first through-grooves TH1 may become narrowed in the direction of the support substrate 100. That is, the width of the first through-grooves TH1 may become narrowed in the direction of the support substrate 100.

In detail, outer regions of the rear electrode layer 200 and the optical absorption layer 300 may be disposed at mutually different areas in the first through-grooves TH1. Thus, in the first through-grooves TH1, the spacing distance D1 between the optical absorption layers 300 divided by the first through-grooves TH1 may be shorter than the spacing distance D2 between the rear electrode layers 200 divided by the first through-grooves TH1.

That is, in the first through-grooves TH1, a part of the optical absorption layer 300 surrounds the inner side surface of the rear electrode layer 200, so that the spacing distance D1 between the optical absorption layers 300 divided by the first through-grooves TH1 may be shorter than the spacing distance D2 between the rear electrode layers 200 divided by the first through-grooves TH1.

The optical absorption layer 300 may include a first optical absorption layer 310 and a second optical absorption layer 320. In detail, the optical absorption layer 300 may include the first optical absorption layer 310 making contact with the top surface of the rear electrode layer 200 and the second optical absorption layer 320 making contact with the lateral side of the rear electrode layer 200. That is, the second optical absorption layer 320 may come into contact with the inner side surface of the rear electrode layer 200 exposed through the first through-grooves TH1.

In detail, in the first through-grooves TH1, the lateral side of the first optical absorption layer 310 may be parallel to the lateral side of the rear electrode layer 200 and the lateral side of the second optical absorption layer 320 may be inclined to the lateral side of the rear electrode layer 200. For example, the second optical absorption layer 320 may be configured to have a width which becomes wider in the direction of the top surface of the support substrate 100.

The first optical absorption layer 310 may be integrally formed with the second optical absorption layer 320. That is, the first optical absorption layer 310 may be integrally formed with the second optical absorption layer 320 by using the same material.

The second optical absorption layer 320, which surrounds the inner side surface of the rear electrode layer, may have a width in the range of about 1 μm to 40 μm.

If the width of the second optical absorption layer 320 is less than 1 μm, the electrons that migrate from the front electrode may come into contact with the rear electrode by passing through the optical absorption layer due to the tunneling effect, thereby causing the short. If the width of the second optical absorption layer 320 exceeds 40 μm, the dead zone area may be increased, thereby deteriorating the efficiency of the solar cell.

The rear electrode layer 200 may be divided into a plurality of rear electrodes by the first through-grooves TH1. That is, the plurality of rear electrodes may be defined by the first through-grooves TH1.

The rear electrodes may be spaced apart from each other by the first through-grooves TH1. The rear electrodes may be arranged in the shape of a stripe.

Alternatively, the rear electrodes may be arranged in the shape of a matrix. In this case, when viewed in a plan view, the first through-grooves TH1 may be provided in the shape of a lattice.

The buffer layer 400 may be disposed on the optical absorption layer 300. In detail, the buffer layer 400 may be disposed on the optical absorption layer 300 formed with the first through-grooves TH1.

Although FIG. 2 shows the buffer layer 400 formed on the top surface of the optical absorption layer 300, the embodiment is not limited thereto. The buffer layer 400 may be formed not only on the top surface of the optical absorption layer 300, but also along the lateral side of the optical absorption layer 300 formed at the inner surface of the first through-grooves TH1.

The buffer layer 400 may include CdS, ZnS, InXSY and InXSeYZn(O, OH). The buffer layer 400 may have a thickness in the range of about 50 nm to about 150 nm and an energy bandgap in the range of about 2.2 eV to about 2.4 eV.

A high resistance buffer layer may be further disposed on the buffer layer 400. The high resistance buffer layer may include zinc oxide (i-ZnO) which is not doped with impurities. The energy bandgap of the high resistance buffer layer may be in the range of about 3.1 eV to about 3.3 eV. The high resistance buffer layer is not an essential element and may be omitted if necessary.

Second through-grooves TH2 may be formed in the buffer layer 400. The second through-grooves TH2 may be open regions to expose the top surface of the rear electrode layer 200. When viewed in a plan view, the second through-grooves TH2 may extend in one direction. The width of the second through-grooves TH2 may be in the range of about 80 μm to about 200 μm, but the embodiment is not limited thereto.

The buffer layer 400 may be defined as a plurality of buffer layers by the second through-grooves TH2. That is, the buffer layer 400 may be divided into the buffer layers by the second through-grooves TH2.

The front electrode layer 500 may be provided on the buffer layer 400. The front electrode layer 500 may be a transparent conductive layer. In addition, the resistance of the front electrode layer 500 may be greater than that of the rear electrode layer 200.

The front electrode layer 500 may include oxide. For example, a material constituting the front electrode layer 500 may include aluminum doped zinc oxide (AZO), indium zinc oxide (IZO) or indium tin oxide (ITO).

The front electrode layer 500 may have a property of an n type semiconductor. In this case, the front electrode layer 500 may constitute an n type semiconductor layer together with the buffer layer and may constitute a p-n junction together with the optical absorption layer 300 which is a p type semiconductor layer. The front electrode layer 500 may have a thickness in the range of about 100 nm to about 1.5 μm, but the embodiment is not limited thereto.

The front electrode layer 500 may fully or partially fill the first through-grooves TH1. In detail, the front electrode layer 500 may extend along the optical absorption layer 300 in the first through-groove TH1.

In addition, the front electrode layer 500 may fully or partially fill the second through-grooves TH2. In detail, the front electrode layer 500 may be formed on the top surface of the buffer layer 400 and in the second through-grooves TH2.

The front electrode layer formed in the second through-grooves TH2 may serve as a connector. In detail, the front electrode layer formed in the second through-grooves TH2 may connect adjacent solar cells with each other.

Third through-grooves TH3 may be formed in the front electrode layer 500. The third through-grooves TH3 may be formed through the front electrode layer 500, the buffer layer 400 and the optical absorption layer 300. The third through-grooves TH3 may pass through a part or all of the buffer layer 400, the high resistance buffer layer and the front electrode layer 500. That is, the third through-grooves TH3 may expose the top surface of the rear electrode layer 200.

The third through-grooves TH3 may be adjacent to the second through-grooves TH2. In detail, the third through-grooves TH3 may be provided beside the second through-grooves TH2. That is, when viewed in a plan view, the third through-grooves TH3 may be formed beside the second through-grooves TH2 in parallel to the second through-grooves TH2. The third through-grooves TH3 may extend in the first direction.

The front electrode layer 500 may be divided into a plurality of front electrodes by the third through-grooves TH3. That is, the front electrodes may be defined by the third through-grooves TH3.

The front electrodes may have a shape corresponding to that of the rear electrodes. That is, the front electrodes may be arranged in the shape of a stripe. Alternatively, the front electrodes may be arranged in the form of a matrix.

In addition, a plurality of solar cells C1, C2, . . . may be defined by the third through-grooves TH3. In detail, the solar cells C1, C2, . . . may be defined by the second and third through-grooves TH2 and TH3. That is, the solar cell according to an embodiment may be divided into the solar cells C1, C2, . . . by the second and third through-grooves TH2 and TH3. In addition, the solar cells C1, C2, . . . may be connected to each other in the second direction crossing the first direction. That is, a current may flow through the solar cells C1 and C2 in the second direction.

In other words, the solar cell panel 10 may include the support substrate 100 and the solar cells C1, C2, . . . . The solar cells C1, C2, . . . may be disposed on the support substrate 100 while being spaced apart from each other. In addition, the solar cells C1, C2, . . . may be connected in series to each other through connecting parts.

The connection parts may be provided inside the second through-grooves TH2. The connection parts may extend downward from the front electrode layer 500 and may be connected with the rear electrode layer 200. For example, the connecting parts may extend from the front electrode of the first cell C1 and may be connected to the rear electrode of the second cell C2.

Accordingly, the connection parts may connect adjacent cells to each other. In detail, the connection parts may connect the front and rear electrodes included in each of the adjacent solar cells.

The connecting part may be integrated with the front electrode layer 500. That is, a material constituting the connecting part may be identical to a material constituting the front electrode layer 500.

The solar cell according to an embodiment can improve the efficiency of the solar cell by reducing the dead zone area in the solar cell.

In the embodiment, the dead zone area signifies a non-generation area in the solar cell and the first to third through-grooves and areas among the first to third through-grooves may be defined as the dead zone area.

According to the related art, after the rear electrode layer is formed on the support substrate, the first through-grooves are formed to divide the rear electrode layer into a plurality of rear electrodes. Then, the optical absorption layer and the buffer layer are formed on the rear electrodes having the first through-grooves. However, the process for forming the optical absorption layer is carried out at the high temperature of 500° C. or above, so the first through-grooves formed in the rear electrode layer may be bent by heat having the high temperature when the optical absorption layer is formed.

For this reason, according to the related art, when second through-grooves have been formed in parallel to and spaced apart from the first through-grooves, the spacing distance between the first through-grooves and the second through-grooves may be increased due to the bending of the first through-grooves, so that the dead zone area may be increased, deteriorating the overall efficiency of the solar cell.

Therefore, according to the solar cell of the embodiment, the process for forming the optical absorption layer is primarily performed in the high temperature, and then the first through-grooves are formed through the optical absorption layer and the rear electrode layer.

Thus, the first through-grooves may not be deformed, that is, may not be bent in the subsequent processes so that the dead zone area may not be increased.

In detail, since the first through-grooves can be prevented from being bent, the width of the first through-grooves can be controlled, that is, can be reduced, so that the dead zone area can be reduced in the solar cell.

In addition, according to the solar cell of the embodiment, the optical absorption layer may be inclined in the first through-grooves. In other words, the optical absorption layer or the second optical absorption layer can surround the lateral side of the rear electrode layer exposed through the first through-grooves.

Since the first through-grooves are formed after the optical absorption layer has been formed as described above, the short between the front electrode and the rear electrode, which may be generated when the front electrode is disposed in the first through-groove, can be prevented.

That is, the optical absorption layer or the second optical absorption layer surrounding the inner side surface of the rear electrode layer may serve as a barrier layer against the electron migration, so that the front electrode layer, which is formed after the first through-grooves have been formed, may prevent the electron migration which may proceed along the lateral side of the optical absorption layer due to the tunneling effect.

In detail, according to the solar cell of the embodiment, the first through-grooves are formed after the optical absorption layer has been formed, so that the width of the first through-grooves can be reduced. In addition, since the optical absorption layer or the second optical absorption layer can surround the inner side surface of the rear electrode layer, the short between the front electrode and the rear electrode can be prevented.

Therefore, according to the solar cell of the embodiment, the dead zone area can be reduced, so that the overall efficiency of the solar cell can be improved.

Hereinafter, the method of manufacturing the solar cell according to the embodiment will be described with reference to FIGS. 3 to 9. FIGS. 3 to 9 are views illustrating the method of manufacturing the solar cell according to the embodiment.

Figure 3:
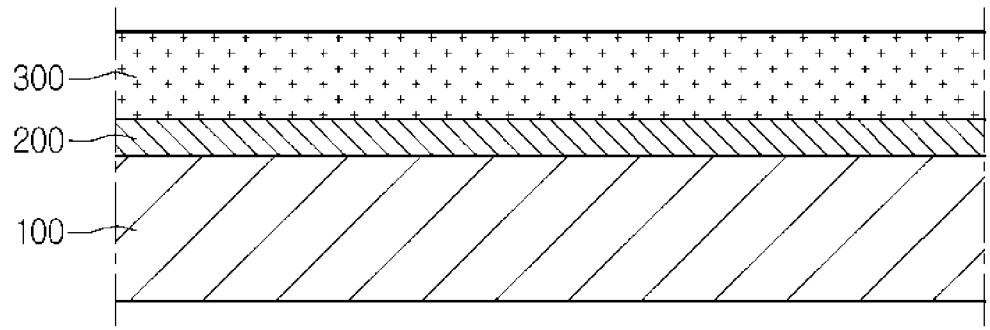
FIGS. 3 to 9 are views illustrating a method of manufacturing a solar cell according to an embodiment.

First, referring to FIG. 3, the rear electrode layer 200 and the optical absorption layer 300 may be formed on the support substrate 100. In detail, the rear electrode layer 200 may be formed on the support substrate 100 and the optical absorption layer 300 may be formed on the rear electrode layer 200.

The rear electrode layer 200 may be formed through PVD (Physical Vapor Deposition) or plating.

In addition, the optical absorption layer 300 may be formed through a sputtering process or an evaporation scheme. For example, the optical absorption layer 300 may be formed by extensively using various schemes including a scheme of forming a $Cu(In,Ga)Se_2$ (CIGS) based-optical absorption layer 300 by simultaneously or separately evaporating Cu, In, Ga, and Se and a scheme of performing a selenization process after a metallic precursor film has been formed.

Regarding the details of the selenization process after the formation of the metallic precursor layer, the metallic precursor layer is formed on the back contact electrode 200 through a sputtering process employing a Cu target, an In target, or a Ga target.

Thereafter, the metallic precursor layer is subject to the selenization process so that the $Cu(In,Ga)Se_2$ (CIGS) based-optical absorption layer 300 is formed.

In addition, the sputtering process employing the Cu target, the In target, and the Ga target and the selenization process may be simultaneously performed.

Alternatively, a CIS or a CIG optical absorption layer 300 may be formed through a sputtering process employing only Cu and In targets or only Cu and Ga targets and the selenization process.

Figure 4:
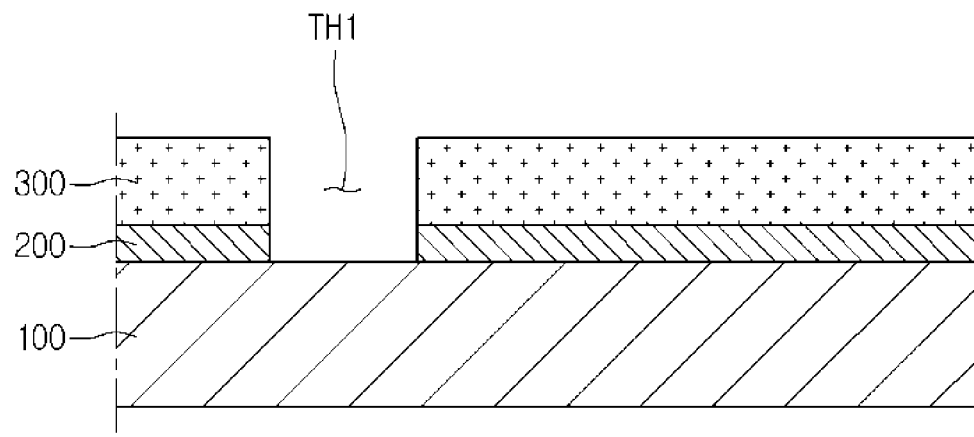

Then, referring to FIG. 4, the optical absorption layer 300 and the rear electrode layer 200 may be partially removed to form the first through-grooves TH1. The first through-grooves TH1 may have a width in the range of about 10 μm to about 100 μm.

The first through-grooves TH1 may be formed by using a mechanical device such as a tip or a laser device. For example, the first through-grooves TH1 may be formed through the optical absorption layer 300 and the rear electrode layer 200 at a time by using a laser having a predetermined wavelength band. In addition, the first through-grooves TH1 may be provided by forming grooves in the buffer layer 400 and the optical absorption layer 300 using a mechanical device such as a tip and then forming grooves on the top surface of the rear electrode layer, which is exposed through the grooves, by using a laser device.

The rear electrode layer 200 may be divided into a plurality of rear electrodes by the first through-grooves TH1. In detail, the rear electrodes may be defined by the first through-grooves TH1.

Figure 5:
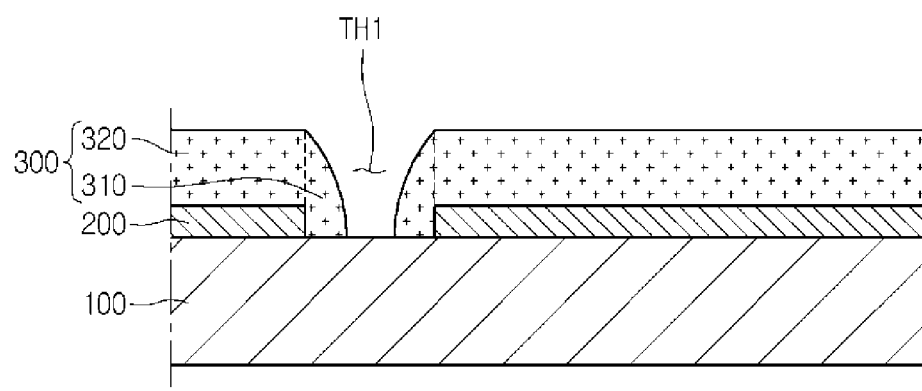

Then, referring to FIG. 5, the optical absorption layer 300 may be partially melted to surround the lateral side of the rear electrode layer 200 exposed through the first through-grooves TH1.

The optical absorption layer 300 may be melted through various schemes.

For example, the lateral side of the optical absorption layer 300 exposed through the first through-grooves TH1 may be melted by using sources such as heat or light. As the lateral side of the optical absorption layer 300 is partially melted, the melted portion of the optical absorption layer 300 may surround the inner side surface of the rear electrode layer 200.

The optical absorption layer 300 that surrounds the inner side surface of the rear electrode layer 200 may have a width in the range of about 1 μm to about 40 μm.

Thus, the inner side surface of the optical absorption layer 300 may be inclined in the first through-grooves TH1. Since the optical absorption layer 300 is inclined in the first through-grooves TH1, the first through-grooves TH1 may have a width which is gradually narrowed in the direction of the support substrate 100.

Figure 6:
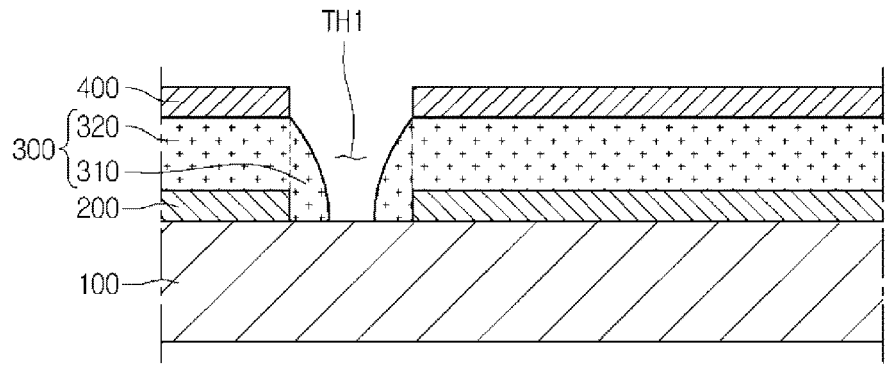

Next, referring to FIG. 6, the buffer layer 400 may be disposed on the optical absorption layer 300.

Various materials, which are generally known in the art as materials for manufacturing the buffer layer of the solar cell, may be used for the buffer layer 400 without special limitations.

For example, the buffer layer 400 may be formed by using one of sputtering, evaporation, CVD (chemical vapor deposition), MOCVD, close-spaced sublimation (CSS), spray pyrolysis, chemical spraying, screen printing, non-vacuum liquid phase deposition, CBD (chemical bath deposition), VTD (vapor transport deposition), atomic layer deposition (ALD) and electrodeposition. In detail, the buffer layer 400 may be formed through the CBD, ALD or MOCVD.

Figure 7:
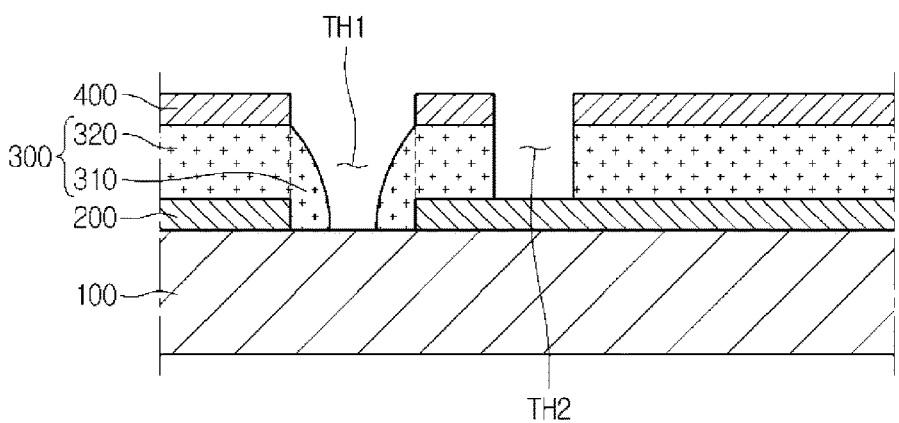

Then, referring to FIG. 7, the optical absorption layer 300 and the buffer layer 400 may be partially removed to form the second through-grooves TH2.

The second through-grooves TH2 may be formed by using a mechanical device such as a tip or a laser device.

For example, the optical absorption layer 300 and the buffer layer 400 may be patterned by using the tip having a width in the range of about 40 μm to about 180 μm. In addition, the second through-grooves TH2 may be formed by using the laser having a wavelength in the range of about 200 nm to about 600 nm.

In this case, the second through-grooves TH2 may have a width in the range of about 80 μm to about 200 μm. The second through-grooves TH2 may expose a part of the top surface of the rear electrode layer 200.

Figure 8:
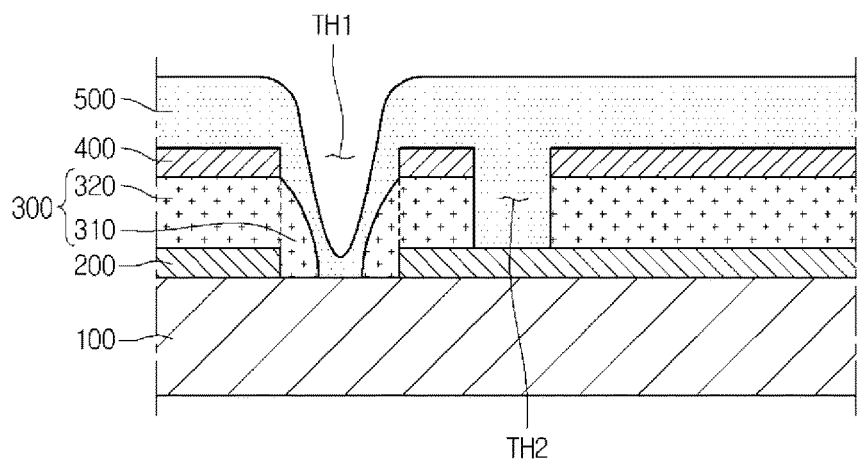

Then, referring to FIG. 8, the front electrode layer may be formed on the buffer layer 400. For example, the front electrode layer 500 may be formed through an RF sputtering scheme using a ZnO target, a reactive sputtering scheme using a Zn target or an MOCVD scheme.

The front electrode layer 500 may fill the first and second through-grooves TH1 and TH2.

Figure 9:
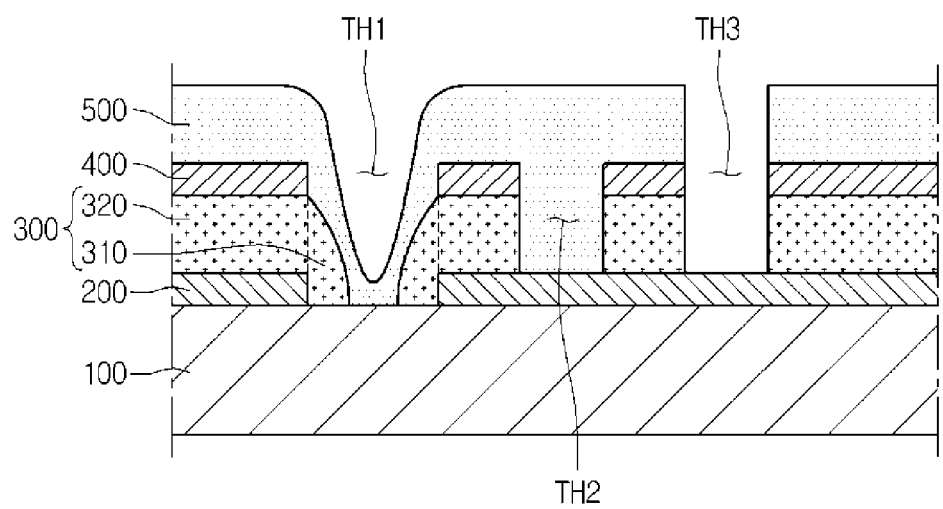

Next, referring to FIG. 9, third through-grooves TH3 may be formed by partially removing the optical absorption layer 300, the buffer layer 400 and the front electrode layer 500. Thus, a plurality of front electrodes, and the first cell C1, the second cell C2, and the third cells C3 may be defined by patterning the front electrode layer 500. Each of the third through-grooves TH3 may have a width in the range of about 80 μm to about 200 μm.

According to the method for manufacturing the solar cell of the embodiment, the first through-grooves are formed through the rear electrode layer and the optical absorption layer after the rear electrode layer and the optical absorption layer have been formed. Then, the optical absorption layer exposed through the first through-grooves is melted to surround the inner side surface of the rear electrode layer exposed through the first through-grooves.

According to the related art, the rear electrode layer is divided into a plurality of rear electrodes by patterning the rear electrode layer and the optical absorption layer, the buffer layer and the front electrode layer are deposited on the rear electrodes to manufacture the solar cell.

However, the deposition process for the optical absorption layer is carried out at the high temperature of 500° C. or above, so the first through-grooves may be bent while the deposition process for the optical absorption layer is being carried out. Due to the bending of the first through-grooves, the dead zone area is increased and the efficiency of the solar cell is deteriorated.

For this reason, according to the method of manufacturing the solar cell of the embodiment, the through-grooves are formed through the rear electrode layer and the optical absorption layer after the rear electrode layer and the optical absorption layer have been formed on the support substrate to prevent the through-grooves from being bent, thereby reducing the dead zone area. In addition, the optical absorption layer is partially melted in the through grooves to surround the inner side surface of the rear electrode layer, so that the short between the front electrode and the rear electrode, which is caused due to the tunneling effect from the front electrode to the optical absorption layer, can be prevented, thereby improving the overall efficiency of the solar cell.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell comprising:
   a support substrate;
   a molybdenum layer on the support substrate;
   an optical absorption layer on the molybdenum layer;
   a first through-groove formed through the molybdenum layer and the optical absorption layer;
   a buffer layer on the optical absorption layer;
   a second through-groove formed through the optical absorption layer and the buffer layer;
   a front electrode layer on the buffer layer; and
   a third through-groove formed through the optical absorption layer, the buffer layer, and the front electrode layer;
   wherein the first through-groove has a width that is gradually narrowed from the buffer layer toward a top surface of the support substrate,
   wherein the second through-groove is disposed between the first through-groove and the third through-groove,
   wherein the optical absorption layer comprises:
   a first optical absorption layer on the molybdenum layer; and
   a second optical absorption layer making contact with an inner side surface of the molybdenum layer exposed through the first through-groove;
   wherein the molybdenum layer directly makes contact with the top surface of the support substrate,
   wherein the buffer layer has an energy bandgap in a range of 2.2 eV to 2.4 eV,
   wherein a spacing distance of the buffer layer corresponds to a spacing distance of the molybdenum layer in the first through-groove,
   wherein the front electrode layer directly makes contact with lateral sides of the buffer layer in the first through-groove,
   wherein the front electrode layer includes a connection part which extends downward from the front electrode layer to the rear electrode and is provided inside the second through-groove,
   wherein the front electrode layer and the connection part are formed integrally and include a same material,
   wherein the front electrode layer directly makes contact with a top surface of the molybdenum layer and is electrically connected with the molybdenum layer by the connection part,
   wherein the third through-groove exposes the top surface of the molybdenum layer,
   wherein lateral sides of the first optical absorption layer exposed through the third through-groove face each other,
   wherein lateral sides of the buffer layer exposed through the third through-groove face each other,
   wherein lateral sides of the front electrode layer exposed through the third through-groove face each other, and
   wherein the lateral sides of the first optical absorption layer, the lateral sides of the buffer layer, and the lateral sides of the front electrode layer exposed through the third through-groove share a same straight line.

2. The solar cell of claim 1, wherein an inner side surface of the optical absorption layer is inclined in the first through-groove.

3. The solar cell of claim 2, wherein the inner side surface of the optical absorption layer includes a curved surface.

4. The solar cell of claim 1, wherein a lateral side of the first optical absorption layer is parallel to a lateral side of the molybdenum layer and inclined with respect to a lateral side of the second optical absorption layer.

5. The solar cell of claim 4, wherein the second optical absorption layer has a width which is gradually enlarged in a direction of the top surface of the support substrate.

6. The solar cell of claim 5, wherein an average width of the second optical absorption layer is in a range of about 1 μm to about 40 μm.

7. The solar cell of claim 4, wherein the first optical absorption layer is integrally formed with the second optical absorption layer.

8. The solar cell of claim 2, wherein the front electrode layer extends along a lateral side of the optical absorption layer in the first through-groove.

9. The solar cell of claim 1, wherein a spacing distance of the optical absorption layer is shorter than the spacing distance of the molybdenum layer in the first through-groove.

10. The solar cell of claim 9, wherein the spacing distance of the optical absorption layer is gradually enlarged in a direction from the top surface of the support substrate to the front electrode, starting from the top surface of the support substrate.

11. The solar cell of claim 9, wherein an inner side surface of the optical absorption layer is inclined in the first through-groove.

12. The solar cell of claim 9, wherein the front electrode layer extends along a lateral side of the optical absorption layer in the first through-groove.

13. The solar cell of claim 9, wherein the optical absorption layer makes contact with the inner side surface of the molybdenum layer, which is exposed through the first through-groove, in the first through-groove.

14. The solar cell of claim 9, wherein an average width of the optical absorption layer is in a range of about 1 μm to about 40 μm in the first through-groove.

15. The solar cell of claim 9, wherein the optical absorption layer covers the inner side surface of the molybdenum layer in the first through-groove.

16. The solar cell of claim 9, wherein the first optical absorption layer is integrally formed with the second optical absorption layer.

17. The solar cell of claim 9, wherein the first optical absorption layer and the second optical absorption layer include a same material.

18. The solar cell of claim 9, wherein an inner side surface of the optical absorption layer includes a curved surface.

19. The solar cell of claim 1, wherein the buffer layer includes one of CdS, ZnS, $In_xS_y$, and $In_xSe_yZn(O,OH)$.

20. The solar cell of claim 1, further comprising a high-resistance buffer layer disposed between the buffer layer and the front electrode layer, wherein the high-resistance buffer layer has an energy bandgap in a range of 3.1 eV to 3.3 eV.

\* \* \* \* \*